United States Patent
Seki et al.

(10) Patent No.: US 7,166,242 B2
(45) Date of Patent: Jan. 23, 2007

(54) COMPOSITION, ORGANIC CONDUCTIVE LAYER INCLUDING COMPOSITION, METHOD FOR MANUFACTURING ORGANIC CONDUCTIVE LAYERS, ORGANIC EL ELEMENT INCLUDING ORGANIC CONDUCTIVE LAYER, METHOD FOR MANUFACTURING ORGANIC EL ELEMENTS SEMICONDUCTOR ELEMENT INCLUDING ORGANIC CONDUCTIVE LAYER, METHOD FOR MANUFACTURING SEMICONDUCTOR ELEMENTS, ELECTRONIC DEVICE, AND ELECTRONIC APPARATUS

(75) Inventors: Shunichi Seki, Suwa (JP); Seiichi Tanabe, Shiojiri (JP); Shingo Kuwashiro, Chino (JP); Hideyuki Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 392 days.

(21) Appl. No.: 10/613,081

(22) Filed: Jul. 7, 2003

(65) Prior Publication Data
US 2004/0144975 A1 Jul. 29, 2004

(30) Foreign Application Priority Data
Aug. 2, 2002 (JP) ............... 2002-226563
Nov. 13, 2002 (JP) ............... 2002-329348

(51) Int. Cl.
*H01B 1/00* (2006.01)
*B05D 5/12* (2006.01)

(52) U.S. Cl. .............. 252/500; 427/98.9; 427/256; 427/372.2

(58) Field of Classification Search ............... 252/500; 523/160; 106/31.92; 427/98.4, 98.9, 256, 427/372.2
See application file for complete search history.

(56) References Cited

U.S. PATENT DOCUMENTS

| 5,132,248 A | | 7/1992 | Drummond et al. |
| 5,403,467 A | * | 4/1995 | Jonas et al. ............... 205/125 |
| 5,766,515 A | * | 6/1998 | Jonas et al. ............... 252/500 |
| 6,083,635 A | | 7/2000 | Jonas et al. |

(Continued)

FOREIGN PATENT DOCUMENTS

EP 1215224 A1 * 6/2002

(Continued)

OTHER PUBLICATIONS

Furusawa et al., "*Late-News Paper*: Inkjet-Printed Bus and Address Electrodes for Plasma Display", *SID 02 Digest*, 2002, pp. 753-755.

(Continued)

*Primary Examiner*—Mark Kopec
(74) *Attorney, Agent, or Firm*—Oliff & Berridge, PLC

(57) ABSTRACT

To provide a composition in which the viscosity is hardly changed with the passage of time and an organic conductive layer including the composition in order to planarize the surface of a layer formed by an inkjet process and in order to stabilize the properties, a composition contains an organic conductive material and at least one solvent, wherein the changing rate of the viscosity thereof is within a range of ±5% when 30 days have passed after the preparation. The solvent preferably contains a glycol medium. An organic conductive layer includes the composition having the above configuration.

21 Claims, 5 Drawing Sheets

U.S. PATENT DOCUMENTS

| | | | |
|---|---|---|---|
| 6,129,986 A | 10/2000 | Bessho et al. | |
| 6,315,927 B1 * | 11/2001 | Kubota et al. | 252/512 |
| 6,358,437 B1 | 3/2002 | Jonas et al. | |
| 6,692,663 B1 * | 2/2004 | Zhou et al. | 252/500 |
| 6,878,312 B1 | 4/2005 | Kanbe et al. | |
| 2002/0077450 A1 * | 6/2002 | Kirchmeyer et al. | 528/373 |
| 2003/0211241 A1 * | 11/2003 | Tahon et al. | 427/231 |

FOREIGN PATENT DOCUMENTS

| | | |
|---|---|---|
| JP | A-57-51781 | 3/1982 |
| JP | A-59-194393 | 11/1984 |
| JP | A-10-248816 | 9/1998 |
| JP | A-11-54270 | 2/1999 |
| JP | A-11-54272 | 2/1999 |
| JP | A-11-134320 | 5/1999 |
| JP | A-2000-91081 | 3/2000 |
| JP | A-2000-106278 | 4/2000 |
| JP | WO 00/59267 | 10/2000 |
| JP | A-2000-323276 | 11/2000 |
| JP | A-2001-52861 | 2/2001 |
| JP | A-2001-167878 | 6/2001 |
| JP | 2001-302953 | 10/2001 |
| JP | A-2002-500408 | 1/2002 |
| KR | 2001-0043918 | 5/2001 |
| TW | 406518 | 9/2000 |
| TW | 490700 | 5/2003 |

OTHER PUBLICATIONS

Sirringhaus et al., "High-Resolution Inkjet Printing of All-Polymer Transistor Circuits", *SCIENCE*, vol. 290, Dec. 15, 2000, pp. 2123-2126.

* cited by examiner

COMPOSITION, ORGANIC CONDUCTIVE LAYER INCLUDING COMPOSITION, METHOD FOR MANUFACTURING ORGANIC CONDUCTIVE LAYERS, ORGANIC EL ELEMENT INCLUDING ORGANIC CONDUCTIVE LAYER, METHOD FOR MANUFACTURING ORGANIC EL ELEMENTS SEMICONDUCTOR ELEMENT INCLUDING ORGANIC CONDUCTIVE LAYER, METHOD FOR MANUFACTURING SEMICONDUCTOR ELEMENTS, ELECTRONIC DEVICE, AND ELECTRONIC APPARATUS

BACKGROUND OF THE INVENTION

1. Field of Invention

The present invention relates to a composition to form conductive layers included in electronic devices, an organic conductive layer including such a composition, a method to manufacture organic conductive layers, an organic EL element including the organic conductive layer, a method to manufacture organic EL elements, a semiconductor element including the organic conductive layer, a method to manufacture semiconductor elements, an electronic device, and an electronic apparatus. In particular, the above conductive layer is used as a conductive portion to form electrodes and wiring lines included in electronic circuits or integrated circuits. The composition according to the present invention can be used for raw materials for various coating processes. An inkjet process is preferably used when organic conductive layers are formed using the composition.

2. Description of Related Art

In the related art, a photolithographic process has been used for forming wiring lines included in electronic circuits or integrated circuits. In such a photolithographic process, a photosensitive material called a resist material is provided above a substrate covered with a conductive layer. A circuit pattern is irradiated and then developed. The conductive layer is then etched along the resist pattern, thereby forming wiring lines. In the photolithographic process, there is a problem in that a complicated process and a large system, such as a vacuum unit, must be used. The manufacturing cost is high because the utilization efficiency of raw materials is several percent and therefore most of the raw materials are wasted. The energy efficiency of the manufacturing process is low.

A conductive layer pattern used for the above integrated circuit or thin-film transistors contains metal, such as copper or aluminum, or indium tin oxide (ITO) and a semiconductor layer pattern used therefor contains silicon in many cases. In the related art, such patterns have been formed according to the following procedure in general. A conductive or semiconductor layer is formed over a substrate by a thermal, plasma, or optical CVD process or the like and unnecessary portions of the layer are then removed by a photolithographic process.

However, in a method for forming a thin-film pattern by a combination of the CVD process and the photolithographic process, there are the technical problems below from a process viewpoint.

(1) When a substrate on which a thin-film is formed has, for example, an irregular surface, a thin-film having a uniform thickness and uniform properties is hardly formed on the substrate because gaseous raw materials are used.

(2) The productivity is low because the rate of forming a thin-film is low.

(3) When the plasma CVD process is used, the costs of purchasing and maintaining a manufacturing apparatus are high because a complicated, expensive high frequency wave-generating and a vacuum unit are necessary.

(4) The manufacturing cost is high because the photolithographic process is complicated and the utilization efficiency of raw materials is low, and the cost of treating waste is also high because a large amount of resist materials and etching solutions are discarded.

Furthermore, in a method for forming a silicon thin-film pattern, there are the technical problems below from a material viewpoint.

(5) Raw materials are hard to handle because the raw materials contain gaseous silicon hydride having high toxicity and reactivity.

(6) In addition, a sealed vacuum unit and piping system must be used because the gaseous raw materials are used. In general, a manufacturing apparatus including such a vacuum unit and piping system is massive and such an apparatus is operated in a clean room. Hence, the maintenance cost is high.

(7) The production cost is high because the above vacuum unit and piping system are expensive and a large amount of energy is consumed in order to form a desired thin-film in such a manner that the vacuum environment and plasma environment are maintained.

In contrast, the following method has been proposed. Liquid (hereinafter referred to as a composition) containing conductive fine particles dispersed therein is applied onto a substrate by an inkjet process so as to form a pattern directly and the applied liquid is then transformed into a conductive layer pattern by thermal treatment or the application of a laser beam (see, for example, U.S. Pat. No. 5,132,248). Furthermore, the following method has been proposed. Bus and address electrodes for plasma displays are formed by an inkjet process using ink containing silver nanoparticles dispersed therein (see, for example, Tech. Digest of SID '02, pp. 753 (2002). According to these methods, the above photolithographic process is not necessary, a process for forming conductive layers can be greatly simplified, and the consumption of raw materials can be reduced. Thus, the methods are fit for manufacturing the above-mentioned electronic circuits and integrated circuits and it is expected that the methods contribute to the reduction of manufacturing cost.

However, in order to form wiring lines, the conductive fine particles must be stacked to a certain degree so as to form a thick layer. That is, if the conductive fine particles are not accumulated, portions in which the conductive fine particles are not in contact with each other cause breaks in wiring lines. If the layer thickness is insufficient, the electric resistance is high, that is, obtained wiring lines are inferior in conductivity.

In the method for directly applying the liquid containing the conductive fine particles dispersed therein onto a substrate by an inkjet process so as to form a pattern directly, the amount of the conductive fine particles provided by discharging the liquid at a constant rate is limited due to the viscosity of the discharged liquid because the liquid contains the conductive fine particles dispersed therein. When a large amount of the liquid is ejected in one shot, it is difficult to adjust positions for forming wiring lines and such wiring lines have a large width, which is not suitable for the integration of electronic circuits or the like.

The relationship between the above-mentioned inkjet process and the composition used in the process has been examined for the following technical subjects in a wide range.

(1) A method for manufacturing organic EL elements each including corresponding hole injection/transport layers formed by an inkjet process using a composition containing a polar solvent and a hole injection/transport material (see, for example, Japanese Patent Application No. 10-248816)

(2) A method in which a composition can be constantly discharged by an inkjet process and satisfactory patterning and layer-forming properties can be obtained when the composition contains an aprotic cyclic solvent, such as DMI or NMP (see, for example, Japanese Patent Application No. 11-134320)

(3) A method in which PEDOT/PSS is used as a hole injection/transport material (see, for example, Japanese Unexamined Patent Application Publication No. 2000-91081)

(4) A method in which plugging can be prevented by the use of a composition containing a glycol solvent having a high boiling temperature (see, for example, Japanese Unexamined Patent Application Publication No. 2001-167878)

(5) A method in which plugging can be prevented, the flatness of layers formed using this composition is satisfactory, and an interface can be prevented from being formed by the use of a composition containing a solvent having a predetermined volatility (vapor pressure) (see, for example, Japanese Unexamined Patent Application Publication No. 2001-52861)

In contrast, a method in which a conductive coating is formed by a screen printing process using paste has been proposed (see, for example, PCT Japanese Translation Patent Publication No. 2002-500408). Since paste has high viscosity in general, paste is not fit for an inkjet process.

On the other hand, Kawase et al. disclosed the following technique in Science: the above material PEDOT/PSS is used for forming source and drain electrodes when organic TFTs are prepared by an inkjet process (see, for example, Science, 15 Dec. 2000, Vol. 290, pp. 2123–2126).

SUMMARY OF THE INVENTION

Related art liquid containing a semiconductive material or a conductive material, such as the above-mentioned conductive fine particles or a conductive polymer, that is, a related art composition has a certain viscosity at the instant that it is prepared. However, there is a problem in that the viscosity of the composition is gradually changed with the passage of time and therefore the viscosity at the instant that the composition is prepared is greatly different from the viscosity at the instant that the composition is discharged.

The significant change in viscosity due to the passage of time causes the following problems. It is difficult to control the amount of ejected droplets and the flatness of layers each disposed between banks is deteriorated. Furthermore, the fact that the composition changes with the passage of time means that there is a problem in that changes in the properties of obtained conductive or semiconductive layers are caused.

Once such layers having an irregular surface have been formed, the surface flatness cannot be improved by drying or heating treatment. For example, when a conductive layer having such an irregular surface is used for forming wiring lines, the following problems are caused. The presence of irregular portions disturbs the flow of electrons or holes passing through the conductive layer, stable conduction cannot be obtained, and the long-term reliability is deteriorated.

Furthermore, when some layer is placed on the conductive layer having the irregular surface, the placed layer is rendered irregular due to the shape of the conductive layer. Electronic circuits and integrated circuits including the above conductive layer and the layer placed thereon are inferior in stability during operation and long-term reliability.

Thus, there are problems in the formation of a layer pattern by an inkjet process and the properties of an element obtained thereby because the viscosity of the related art composition cannot be maintained constant.

The present invention has been made to address the above fact. In order to obtain a layer, formed by an inkjet process, having a flat surface and in order to enhance the properties of functional layers formed by the above process and the reliability of elements, an aspect of the present invention provides a composition in which the viscosity hardly changes with the passage of time, an organic conductive layer including such a composition, a method to manufacture organic conductive layers, an organic EL element including the organic conductive layer, a method to manufacture organic EL elements, a semiconductor element including the organic conductive layer, a method to manufacture semiconductor elements, an electronic device, and an electronic apparatus.

In order to address the above problems, an aspect of the present invention provides a composition containing an organic conductive material and at least one species of solvent, wherein the changing rate of the viscosity is within a range of ±5% when 30 days have passed after the preparation.

In the composition containing the above components, the viscosity can be maintained constant for an extremely long time as compared with the related art. Therefore, the thickness of a coating including the composition can be securely reduced or prevented from changing with the passage of time, thereby obtaining a conductive layer, semiconductive layer, and semiconductor element having high reliability.

The composition containing the above components is satisfactory in long-term storage property because the changing rate of the viscosity is small. Furthermore, the composition can be marketed alone and used in various industrial applications because the composition can be manufactured at low cost by a mass production process.

The solvent, which is a component of the composition according to an aspect of the present invention, preferably contains a glycol medium. Thereby, the changing rate of the viscosity of the composition can be greatly decreased. In this case, when the content of the glycol medium in the solvent ranges from 40 to 55 percent by weight, plugging can be reduced or prevented while the composition is discharged from nozzle holes by an inkjet process. Furthermore, the discharged composition can be reduced or prevented from flying in an arc, that is, the discharged composition can fly in a straight line so that layers are formed, thereby enhancing the flatness and the surface profile of the obtained layers. Thus, in an organic EL element including a hole injection/transport layer formed using each layer described above, the pixel flatness is greatly enhanced.

The above glycol medium includes diethylene glycol and a mixture containing the same, monoethylene glycol and a mixture containing the same, and triethylene glycol and a mixture containing the same.

The organic conductive material contained in the composition according to an aspect of the present invention includes polythiophene derivatives, a mixture of polydioxythiophene and polystyrene sulfonic acid, and a mixture of polyaniline and polystyrene sulfonic acid.

The solvent contained in the composition according to an aspect of the present invention contains an acetylenic alcohol surfactant, whereby the dispersibility of the above material can be enhanced.

Furthermore, the surface tension of the composition can be reduced, whereby the wettability to a substrate can be enhanced. Since the above surfactant is characterized in that bubbles are hardly formed, bubbles can be reduced or prevented from remaining in the composition, thereby obtaining uniform, dense layers having no defect. In particular, when the composition according to an aspect of the present invention contains 0.01 to 0.1 percent by weight of the acetylenic alcohol surfactant, layers including the composition are satisfactory in flatness.

When the acetylenic alcohol surfactant has a boiling point that is less than or equal to that of the medium as well as the surfactant contained in the solvent, the drying time of layers prepared by discharging the composition can be adjusted to that of the solvent, thereby reducing or preventing the surfactant from remaining after the removal of the solvent. Therefore, the layers including the composition containing the above components are usually satisfactory in flatness and uniformity. When a hard-to-remove surfactant, for example, a surfactant having a high boiling point, is used, the properties of conductive layers and semiconductive layers are deteriorated due to the remaining surfactant in some cases. In particular, the acetylenic alcohol surfactant is preferably 3,5-dimethyl-1-octyne-3-ol.

When the composition according to an aspect of the present invention is subjected to degassing treatment, the discharging stability of the composition discharged form nozzle holes by an inkjet process is enhanced, thereby enhancing the flatness and surface profile of obtained layers. Thus, for example, organic EL elements, each including corresponding hole injection/transport layers including the above layers are securely enhanced in pixel flatness.

The degassing treatment includes vacuum treatment, ultrasonic treatment, membrane separation, heating treatment, and gas replacement. The vacuum treatment is preferably used because gas can be continuously removed without depending on the viscosity. When the membrane separation is employed, a membrane (gas-liquid separating membrane) having high solvent resistance must be used.

In the degassing treatment, the component ratio of the composition is apt to change due to the vaporization of volatile components. In particular, in the vacuum treatment, the degree of vacuum must be increased in order to remove remaining gas more sufficiently, whereby the component ratio of the composition is apt to change due to the vaporization of volatile components. This tendency is particularly strong when the composition contains a high vapor-pressure medium, such as water. The change in component ratio causes the deterioration of layer-forming property (flatness) in addition to the change in characteristic and the deterioration of discharging stability. Therefore, before the degassing treatment, the composition preferably contains an amount of the medium vaporized in the degassing treatment in advance. Thereby, the component ratio of the composition can be reduced or prevented from deviating from the optimum ratio in the degassing treatment.

An organic conductive layer according to an aspect of the present invention contains the above-mentioned composition.

As described above, the composition of an aspect of the present invention has such long-term stability that the changing rate of the viscosity is within a range of ±5% when 30 days have passed after the preparation. Therefore, when such an organic conductive layer is formed using the composition as a raw material, the following problem can be reduced or prevented if the layer flatness is achieved in an initial stage of the layer formation: the flatness is deteriorated with the passage of time. Thus, the organic conductive layer containing the above composition is fit for mass production. Furthermore, since it is not necessary to perform the planarizing treatment of the layer, the manufacturing cost can be saved. When another layer is provided on the organic conductive layer, the obtained layer can be readily planarized without depending on the properties of the obtained layer because the organic conductive layer is satisfactory in flatness. Thus, the organic conductive layer is fit for electronic device applications in which a multilayer structure is used. An organic semiconductor element and electronic device obtained according to the above procedure, have high reliability.

A method to manufacture organic conductive layers according to an aspect of the present invention includes an application step of applying the above-mentioned composition to different portions by an inkjet process.

As described above, the composition of an aspect of the present invention is characterized in that the changing rate of the viscosity is small. Therefore, when the composition is discharged from minute nozzle holes by an inkjet process, the nozzle holes being plugged due to the change in viscosity can be reduced or prevented. Thus, the composition can be constantly discharged from the nozzle holes and a desired discharging rate can be constantly achieved without depending on the period of the discharging operation. In particular, in an organic conductive layer-manufacturing method including an application step of intermittently applying the composition to different portions to form layers, the use of the composition enables the discharging rate thereof to be precisely controlled, thereby rendering the layer thickness uniform.

Furthermore, in the organic conductive layer-manufacturing method including an applying step of applying the composition to different portions by an inkjet process, layers having different characteristics can be formed by feeding the composition, in which the chemical makeup is gradually varied, to the nozzle holes or by using inkjet heads each discharging corresponding compositions different from each other. Thus, according to this manufacturing method having the above configuration, for example, regions having different conductive characteristics can be readily formed at desired locations on a substrate.

The above-mentioned organic conductive layer-manufacturing method includes a drying step of removing a solvent after the application step.

Since the drying step of removing the solvent is provided, the solvent is removed from the organic conductive layer formed in the application step, thereby obtaining layers having a flat, dense structure with high reproducibility.

In particular, when the drying step is performed in a vacuum atmosphere, the efficiency of removing the solvent from the layers is enhanced while the layers are maintained flat. Furthermore, when the drying step is performed at a pressure of $1.333 \times 10^{-3}$ Pa ($10^{-5}$ Torr) or less and a temperature substantially equal to room temperature, the flat organic conductive layers can be efficiently formed in a short time. The term room temperature herein refers to a temperature of, for example, 15 to 27° C.

The organic conductive layer-manufacturing method according to an aspect of the present invention includes a heating step of performing thermal treatment at 100° C. or more after the drying step.

When the organic conductive layers, from which the solvent has been removed in the drying step, are subjected to the heating step of performing thermal treatment at a temperature of 100° C. or more, the organic conductive layers can be rendered dense, thereby enhancing the adhesion of each organic conductive layer to a substrate (base layer) or another layer disposed on the organic conductive layer. The heating step is advantageous in that the solvent, contained in the composition, for dispersion can be sufficiently removed from the organic conductive layers.

When an infrared ray unit is used for a heat source of the heating step, the organic conductive layers can be efficiently heat-treated without causing the organic conductive layer to be in contact with the heat source, which is preferable.

An organic EL element according to an aspect of the present invention includes each organic conductive layer functioning as a hole injection/transport layer.

Since the organic conductive layer having the above advantages, that is, the organic conductive layer that is advantageous in that the flatness and uniformity are satisfactory and the solvent can be sufficiently removed, is used as a hole injection/transport layer, the organic EL element has invariable element efficiency and long element life. The term element efficiency herein refers to a luminance per unit current, and the term element life refers to the time that elapses until the luminance of a light-emitting element to which a current has not applied yet decreases by half when a constant current is continuously applied to the element.

A method to manufacture organic EL elements according to an aspect of the present invention includes a step of forming hole injection/transport layers each including the organic conductive layer by an inkjet process.

According to the organic EL element-manufacturing method having the above configuration, the hole injection/transport layers can be each readily formed in corresponding recessed, flat regions having an extremely small area by an inkjet process, wherein the hole injection/transport layers each include the organic conductive layer from which the solvent has been sufficiently removed, the organic conductive layer being satisfactory in flatness.

That is, in the organic EL element-manufacturing method, the hole injection/transport layers that affect the element efficiency and element life of the organic EL elements can be each readily formed in corresponding desired regions by an inkjet process using different materials. Therefore, the manufacturing cost of the elements can be greatly reduced as compared with related art methods using a vacuum unit. Thus, the organic EL element-manufacturing method according to an aspect of the present invention provides the organic EL elements having invariable element properties at low cost.

An electronic device (referred to as an organic EL device) according to an aspect of the present invention includes at least each organic EL element described above and a circuit for driving the organic EL element.

Since the electronic device having the above configuration includes the above organic EL element having invariable element properties, the use of the circuit to drive the element enhance the long-term reliability.

An electronic apparatus according to an aspect of the present invention includes the electronic device.

Since the electronic apparatus having the above configuration includes the electronic device having high long-term reliability, the life of the electronic apparatus can be enhanced.

An organic semiconductor element according to an aspect of the present invention includes a source, a drain, a gate and/or wiring lines, which are conductive portions included in an integrated circuit, each including the organic conductive layer.

In the organic semiconductor element having the above configuration, since the source, the drain, the gate and/or the wiring lines, which are conductive portions included in an integrated circuit, each include the organic conductive layer which is superior in stability, hillocks (protrusions formed on a wiring layer with the passage of time during the heat treatment or the operation in the manufacturing steps) functioning as obstacles are hardly formed. Thus, the passage of current can be constantly maintained for a long time. Thereby, the organic semiconductor element having high long-term reliability can be provided.

A method for manufacturing organic semiconductor elements according to an aspect of the present invention includes a step of forming a source, a drain, a gate or wiring lines, which are conductive portions included in an integrated circuit, by an inkjet process using the above-mentioned organic conductive layer.

According to the organic semiconductor element-manufacturing method having the above configuration, the organic semiconductor elements having high long-term reliability can be formed by an inkjet process, which is a process that layers are precisely formed (patterned) in a simple manner. Therefore, the manufacturing cost of the organic semiconductor elements can be greatly saved as compared with related art methods using a vacuum unit. Thus, the organic semiconductor element-manufacturing method according to an aspect of the present invention contributes to the production of the inexpensive organic semiconductor elements.

DETAILED DESCRIPTION OF PREFERRED EMBODIMENTS

Figure 1:
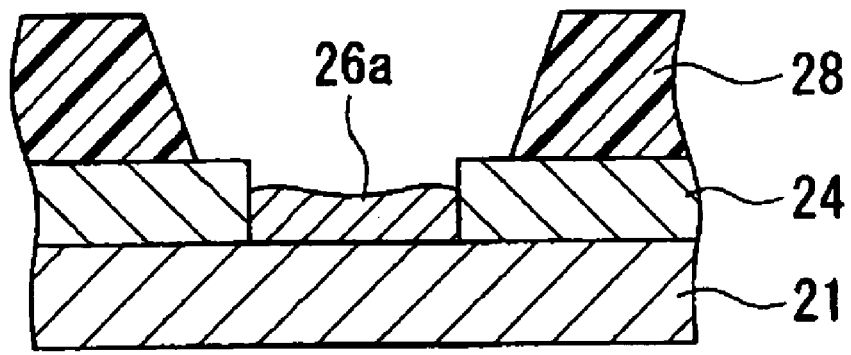
FIG. 1 is a schematic sectional view showing an organic conductive layer including composition A according to an exemplary embodiment of the present invention.

A composition according to an aspect of the present invention will now be described in detail.

The composition of an aspect of the present invention contains an organic conductive material and at least one species of solvent, wherein the changing rate of the viscosity is within a range of 35 5% when 30 days have passed after the preparation.

A combination of the organic conductive material and the solvent contained in the composition does not depend on the molecular weight of the organic conductive material, and any combination may be used as long as an obtained composition has conductivity.

The above organic conductive or semiconductive material includes a high-molecular weight material, such as a mixture of polydioxythiophene and polystyrene sulfonic acid, a mixture of polyaniline and polysulfonic acid, a precursor of polyparaphenylene vinylene, polypyrrole, or a derivative of these materials. Furthermore, the organic conductive or semiconductive material includes a low-molecular weight material, such as copper phthalocyanine (CuPc), 1,1-bis(4-N,N-dinitrylaminophenyl)cyclohexane, or tris(8-hydroxyquinolinol)aluminum.

The solvent forms the composition, which is liquid, by mixing with the organic conductive or semiconductive material. In order to disperse the organic conductive or semiconductive material uniformly, the solvent contains various media depending on the material.

In particular, a polar solvent is preferably employed when a mixture of polydioxythiophene and polystyrene sulfonic acid or a mixture of polyaniline and polysulfonic acid, is used, wherein these polymer materials have high conductivity. Such a polar solvent includes, for example, water; isopropyl alcohol; normal butanol; γ-butyrolactone; N-methylpyrrolidone; 1,3-dimethyl-2-imidazolidinone and derivatives of thereof; glycols such as diethylene glycol, monoethylene glycol, and triethylene glycol; and glycol ethers of these glycols The inventors have examined the above combinations for the storage stability of the composition. As a result, the inventors found that a decrease in changing rate of viscosity, which is one of various characteristics of the composition, is effective in enhancing the storage stability when the composition is prepared by mixing an organic conductive material with at least one species of solvent. In particular, it is known that the storage stability of the prepared composition has a great effect on the properties and shape of obtained layers and the properties of elements including these layers because the composition containing the above components is used as a raw material to prepare the layers.

However, a close examination has not been made for an influence exerted on the properties of the layers by the changing rate of the viscosity of the composition having the above combination. Therefore, the inventors prepared two types of compositions A and B shown in Table 1 and examined the changing rate of the viscosity thereof.

TABLE 1

| | Components of Solvent | Amount |
|---|---|---|
| Composition A | PEDOT-PSS dispersion | 28 g |
| | Water | 22 g |
| | Diethylene glycol | 50 g |
| | 3,5-dimethyl-1-octyne-3-ol | 100 mg |
| Composition B | PEDOT-PSS dispersion | 28 g |
| | N-methylpyrrolidone | 22 g |
| | 1,3-dimethyl-2-imidazolidinone | 50 g |

The term PEDOT-PSS Dispersion means 3,4-polyethylenedioxythiophene/polystyrene sulfonic acid (BAYTRON $^{(P)}$P, manufactured by Bayer AG). Special-grade diethylene glycol (DEG for short) manufactured by Kanto Kagaku was used and 3,5-dimethyl-1-octyne-3-ol marketed under the trade name of SF 61 by Air Products and Chemicals Inc. was used.

Special-grade N-methylpyrrolidone (NMP for short) manufactured by Kanto Kagaku was used and special-grade 1,3-dimethyl-2-imidazolidinone (DMI for short) manufactured by Aldrich Chemical Company was used.

The component ratio of the compositions shown in Table 1 was obtained after degassing treatment. The degassing treatment was performed by placing each composition in a chamber having a pressure of about 160 Pa or less. In this degassing treatment, it is known that about 4% of the solvent is vaporized. That is, media having a relatively high vapor pressure (for example, water and so on) are vaporized but media having a relatively low vapor pressure (for example, DEG, NMP, DMI, and so on) are not vaporized. Therefore, before the degassing treatment, the composition was arranged to contain a medium (herein water) by about 4 percent by weight higher than the optimum amount. For example, composition A contained the following components before the degassing treatment: 28 g of PEDOT-PSS dispersion, 26 g of water, 50 g of diethylene glycol, and 100 mg of 3,5-dimethyl-1-octyne-3-ol. The compositions had a viscosity of 17.1 mpa·s after the degassing treatment and this value was the same as the viscosity of the compositions, not subjected to the degassing treatment, containing 22% of water. The measurement of the viscosity was performed at 20° C.

Table 2 shows results obtained by measuring the two species of compositions A and B for the changing rate of the viscosity. In the number of days shown in Table 2, the number "0" means that the measurement was performed just after the preparation and the number "1" means that the measurement was performed after 24 hours of the preparation.

TABLE 2

| | Number of Days after Preparation of Composition | | | | | | | |
|---|---|---|---|---|---|---|---|---|
| | 0 | 1 | 2 | 5 | 10 | 15 | 20 | 25 |
| Composition A | 0.0 | 0.2 | 0.1 | 0.1 | 0.3 | 1.0 | 1.5 | 1.0 |
| Composition B | 0.0 | 0.1 | 0.4 | 2.7 | 6.8 | 14.4 | 18.3 | 22.0 |

As shown in Table 2, in composition A, the changing rate of the viscosity remains within a range of ±2% when 30 days have passed after the preparation. In contrast, in composition B, which is known, the changing rate of the viscosity is 5% or less until five days have passed after the preparation; however, the changing rate of the viscosity sharply rises after ten days of the preparation and reaches 20% after 20 days.

These results show that the stability of the viscosity of composition A is extremely high, that is, composition A is excellent in long-term stability over 30 days after the preparation. In contrast, in composition B, the changing rate of the viscosity is outside a range of ±5% when 20 days have passed after the preparation. That is, composition B is inferior in storage stability to composition A.

A close examination has not been ever made for such an influence that is exerted on the surface shape of layers (the cross-sectional profiles of layers) by the change (changing rate) of the viscosity of the composition when thin-films are each formed in corresponding recessions having a minute area by an inkjet process using compositions having different changing rates of viscosity. Therefore, the inventors prepared thin-films using compositions having different changing rates of viscosity, the changing rates being different from each other when 30 days have passed after the preparation. The inventors also examined influences exerted on the surface shape of the obtained thin-films by the change (changing rate) of the composition viscosity.

FIGS. 1 and 2 are schematic sectional views showing situations in which layers 26 (a thickness of about 50 nm) formed by an inkjet process using three species of compositions having different changing rates of viscosity are each disposed in corresponding micro-regions having a recessed shape.

Base members, shown in FIGS. 1 and 2, including recessions having a minute area were prepared according to the following procedure: $SiO_2$ banks 24 (a thickness of about 100 nm) each including a $SiO_2$ layer are each provided on corresponding substrates 21 having ITO, and predetermined etching treatment was performed so that the circular recessions having a minute area and a diameter of 40 µm were arranged. Each recession had a perpendicular wall (a height of about 100 nm) and a bottom at which the surface of each substrate 21 including ITO was exposed. Organic banks 28 (partitions having a thickness of about 2 µm) including an acrylic material are each provided only on corresponding $SiO_2$ banks 24.

FIG. 1 shows a structure including composition A of the present invention, that is, a structure including a composition in which the changing rate of the viscosity is within a range of ±2% when 30 days have passed after the preparation. FIG. 2 shows a structure including composition B of a comparative example, that is, a structure including a composition in which the changing rate of the viscosity is outside a range of ±5% after the preparation.

FIG. 1 illustrates that a layer 26a including composition A of an aspect of the present invention has a surface on which the center region is flat and the periphery region that is in contact with the wall of each $SiO_2$ bank 24 is substantially flat as well as the center region.

Figure 2A:
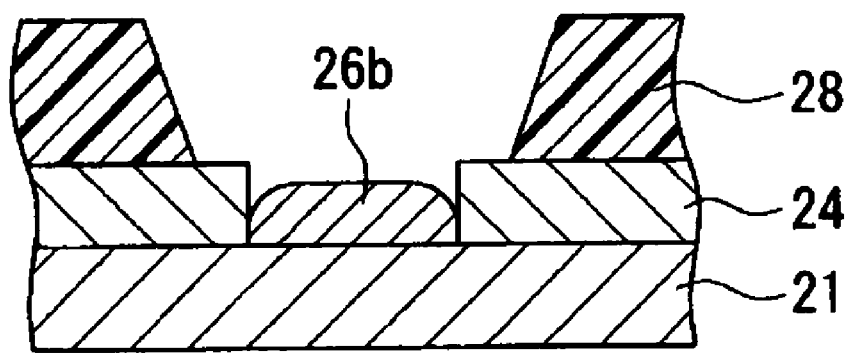
FIG. 2 is a schematic sectional view showing an organic conductive layer including composition B according to an exemplary embodiment of the present invention.
Figure 2B:
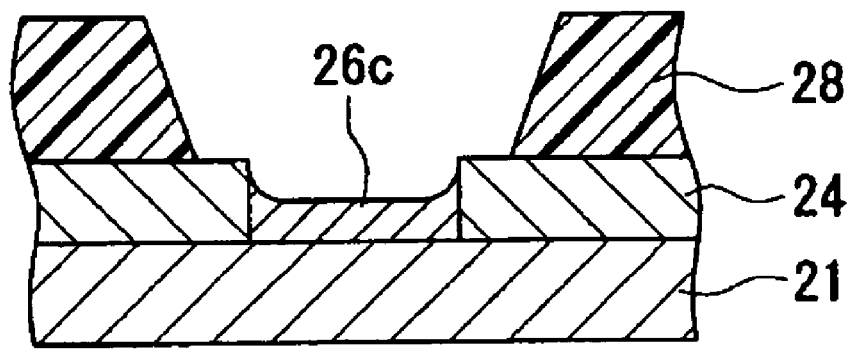

In contrast, a layer 26b including composition B, in which the changing rate of the viscosity is outside a range of ±5% when 30 days have passed after the preparation, has a surface having two types of cross-sectional profiles shown in FIG. 2. FIG. 2(a) shows a structure including composition B in which the changing rate of the viscosity is outside a range of ±5% when 10 days have passed after the preparation. In a layer 26b, the center region of the surface is flat; however, the periphery region of the layer 26b inclines downward, the periphery region being in contact with the wall of the $SiO_2$ bank 24. FIG. 2(b) shows a structure including composition B in which the changing rate of the viscosity is outside a range of ±20% when 30 days have passed after the preparation. In a layer 26c, the center region of the surface is flat; however, the periphery region of the layer 26c inclines upward, the periphery region being in contact with the wall.

From the results shown in FIGS. 1 and 2, the inventors have found that the layer 26a including composition A, in which the changing rate of the viscosity of composition A is within a range of ±5% when 30 days have passed after the preparation, is satisfactory in flatness. In particular, the inventors have confirmed from the above-mentioned experiments that not only the center of the layer 26a is flat but also the periphery region of the layer 26a that is in contact with the wall is substantially flat as well as the center region.

The solvent, which is a component of composition A that has a small changing rate of viscosity and is fit for forming layers having satisfactory flatness, contains a alcohol medium.

When the content of the glycol medium in the solvent is 40 to 50 percent by weight, the layer flatness can be maintained within a range of ±20%. In particular, the glycol medium is preferably diethylene glycol or triethylene glycol.

The organic conductive material, which is a component of the composition that has a small changing rate of viscosity, can be dissolved or dispersed in the solvent, and is fit for forming layers having satisfactory flatness, is preferably a polythiophene derivatives, a mixture of polydioxythiophene and polystyrene sulfonic acid, and a mixture of polyaniline and polysulfonic acid.

When the solvent contained in the above-mentioned composition contains an acetylenic alcohol surfactant, the dispersibility of the organic conductive material, as well as the solvent, contained in the composition can be enhanced and therefore the surface tension of the composition can be adjusted. When layers are formed using the composition by the inkjet process, the enhancement of the dispersibility prevents inkjet nozzle holes from being plugged with solid contents in the composition and provides uniform layers. Furthermore, the adjustment of the surface tension contributes to maintain the contact angle of the composition, disposed at the nozzle holes, at an appropriate value and therefore the composition discharged from the nozzle holes can be reduced or prevented from flying in an arc, thereby allowing the discharged composition to fly in a straight line with stability. Furthermore, when the composition placed on the substrate has an appropriate surface tension, the wettability of the composition on the substrate can be controlled, thereby enhancing the layer flatness.

The content of the acetylenic alcohol surfactant is preferably 0.01 to 0.1 percent by weight because the layer flatness can be maintained within a range of ±20% when the thin-films are each formed in the corresponding minute regions having a recessed shape.

When the acetylenic alcohol surfactant has a boiling point less than or equal to the boiling point of the medium, as well as the surfactant, contained in the solvent, the surfactant enhances the efficiency of organic EL elements each including corresponding layers, including the composition containing the surfactant, each functioning as a hole injection/transfer layer and also enhances the life of such elements.

In particular, the acetylenic alcohol surfactant having the above advantages includes 3,5-dimethyl-1-octyne-3-ol.

Organic Conductive Layer and Method to Manufacture the Same

An organic conductive layer according to an aspect of the present invention includes the above-mentioned composition having such long-term stability that the changing rate of viscosity is within a range of ±5% when 30 days has passed after the preparation, as described above. Therefore, flat layers can be obtained without depending on the storage period of the composition. Thus, the organic conductive layer having the above configuration is fit for mass production and contributes to reduce the manufacturing cost greatly because a step of planarizing the layer is not necessary after the formation.

Since the organic conductive layer having the above configuration is excellent in surface flatness without depending on the storage period of the composition, another layer placed on the organic conductive layer can be readily planarized without depending on the material properties of the placed layer when electronic devices, such as an organic EL element and an organic semiconductor device described below are manufactured. Thus, the organic conductive layer an aspect of the present invention is fit for the manufacture of such electronic devices including a plurality of stacked layers.

A method to manufacture organic conductive layers according to an aspect of the present invention includes an applying step of applying the above composition to different portions by an inkjet process.

As described above, the composition according to an aspect of the present invention has such an advantage that the changing rate of viscosity is small. Therefore, the composition can be continuously discharged from nozzle holes with stability without causing such a problem that the nozzle holes are plugged due to a change in viscosity. Thus, the discharging rate can be maintained constant during the discharging operation without depending on the storage period of the composition. In particular, in the organic conductive layer-manufacturing method including an applying step of intermittently applying the composition to different portions to form layers, the discharging rate can be precisely controlled by the use of the composition, thereby rendering the layer thickness uniform.

Furthermore, in an organic conductive or semiconductive layer-manufacturing method including an applying step of applying a composition to different portions by an inkjet process, layers having different characteristics can be formed by feeding the composition, in which the chemical makeup is gradually varied, to the nozzle holes or by using inkjet heads each discharging corresponding materials (compositions) different from each other. Thus, according to this manufacturing method having the above configuration, for example, regions having different conductive characteristics can be readily formed at desired locations on a substrate.

The organic conductive layer-manufacturing method includes a drying step of removing a solvent after the application step.

Since the method includes the drying step of removing the solvent, layers that are flat and dense can be obtained with high reproducibility by removing the solvent from the applied liquid.

In particular, the efficiency of removing the solvent from the obtained layers can be enhanced by performing the drying step under vacuum conditions. Furthermore, flat organic conductive layers can be efficiently formed in a shorter time under the following vacuum conditions: a pressure of $1.333 \times 10^{-3}$ Pa ($10^{-5}$ Torr) and a temperature substantially equal to room temperature.

The organic conductive layer-manufacturing method includes a heating step of performing thermal treatment at a temperature of 100° C. or more after the drying step.

When the organic conductive layers from which the solvent has been removed in the drying step are subjected to the heating step of performing thermal treatment at a temperature of 100° C. or more, an organic conductive material contained in the composition included in the organic conductive layers is rendered dense, thereby enhancing the adhesion of each organic conductive layer to a substrate (base layer) or another layer disposed on the organic conductive layer. The heating step is advantageous in that the solvent, contained in the composition, for dispersion or dissolution can be sufficiently removed from the organic conductive layers.

When an infrared ray unit is used for a heat source of the heating step, the organic conductive layers can be heat-treated without causing the organic conductive layer to be in contact with the heat source, thereby removing the solvent efficiently.

Organic EL Element and Electronic Device Including the Same

An organic EL element according to an exemplary embodiment of an aspect of the present invention and an electronic device, commonly called an organic EL device, including the organic EL element will now be described in detail with reference to FIG. 3.

Figure 3:
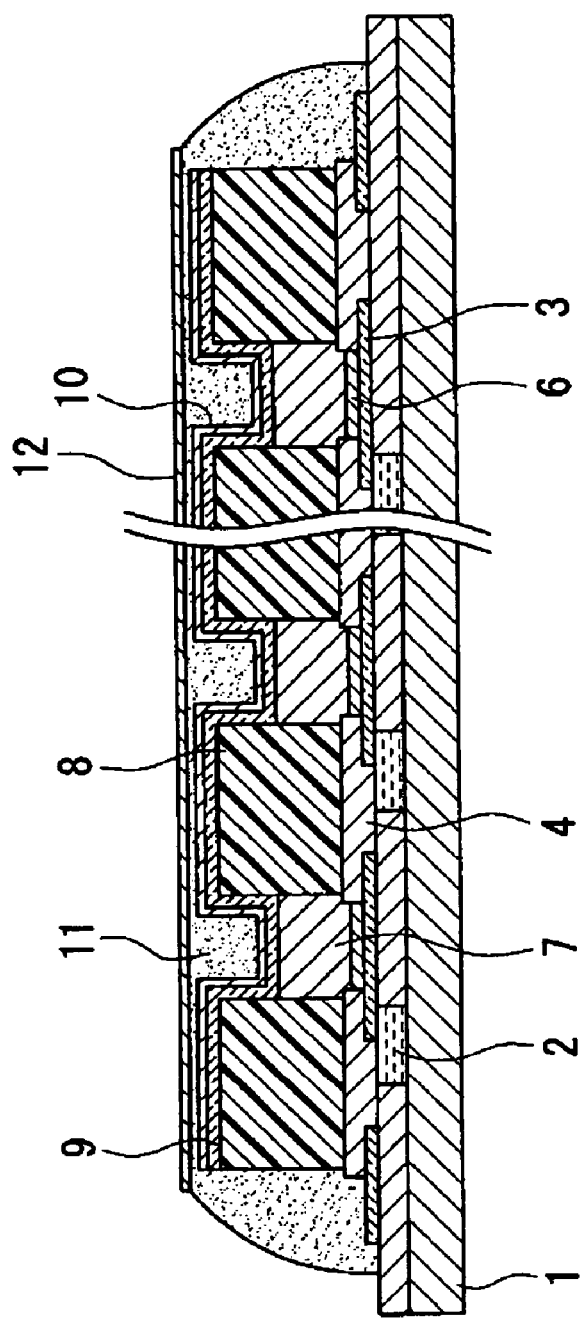
FIG. 3 is a sectional view showing a principal portion of an exemplary electronic device including organic EL elements according to an exemplary embodiment of the present invention.

FIG. 3 is a sectional view showing a principal portion of an exemplary electronic device including organic EL elements each including the above-mentioned organic conductive layer according to an aspect of the present invention, wherein the organic conductive layer functions as a hole injection/transfer layer. The organic EL device shown in FIG. 3 includes the organic EL elements having a configuration in which light is emitted in the direction of a substrate 1, the organic EL elements being of a substrate-side light emission type. This technique for using the organic conductive layer for the hole injection/transport layer is also applicable to another organic EL element having a configuration in which light is emitted in the direction of a substrate 12, which is not shown, this organic EL element being of a sealing-side light emission type.

The organic EL device according to an aspect of the present invention includes the substrate 1; anodes (first electrodes) 3 and a cathode (second electrode) 9 disposed above a surface of the substrate 1, each anode 3 and the cathode 9 forming a pair; light-emitting layers (EL layers) 7, each disposed between the corresponding anodes 3 and the cathode 9, including an organic EL material; hole injection/transport layers 6; and a sealing substrate 12.

The anodes 3 are transparent and the cathode 9 is reflective. The anodes 3 each function as a pixel electrode connected to each light-emitting pixel functioning as a pixel. The cathode 9, each light-emitting layer 7, each hole injection/transport layer 6, and each anode 3 form the organic EL element according to an aspect of the present invention.

The hole injection/transport layers 6 and the light-emitting layers 7 are partitioned with a plurality of partitions (banks) 8 and horizontally arranged in a separated, distributed manner, and each hole injection/transport layer 6 and light-emitting layer 7 form a pixel. $SiO_2$ (silicon oxide) 4 is disposed under each partition 8. The sealing substrate 12 is joined to the substrate 1 with an adhesive layer 11 disposed therebetween. The organic EL elements, each including the cathode 9, the corresponding light-emitting layers 7, the corresponding hole injection/transport layers 6, and the corresponding anodes 3, are sealed with the sealing substrate 12 and the adhesive layer 11. A surface of the sealing substrate 12 close to the cathode 9 is covered with a protective layer 10. TFTs (thin-film transistors) 2 for controlling currents applied to the anodes 3 are arranged on the substrate 1 and each TFT 2 is a component of a circuit for driving each organic EL element.

The organic EL elements included in the electronic device shown in FIG. 3 each include the organic conductive layer of an aspect of the present invention which functions as each hole injection/transport layer 6. The hole injection/transport layer 6 is placed in a region surrounded by the partitions 8 and must have a flat surface. Since the organic conductive layer according to an aspect of the present invention is used as the hole injection/transport layer 6, the center section of the layer surface is flat and the periphery section of the layer surface as well as the center section is flat, the periphery section being in contact with the partitions 8. When each light-emitting layer 7 is placed on the corresponding hole injection/transport layer 6, the light-emitting layer 7 has a surface that is flat from the center section to the periphery section, because the periphery portion of the organic conductive layer functioning as a base layer is flat. As a result, light emitted from the light-emitting layer 7 is propagated in each organic EL element according to predetermined optical design.

The organic EL element including the organic conductive layer functioning as the hole injection/transport layer 6 in which holes move has high reliability, wherein the organic conductive layer is satisfactory in surface flatness and has high long-term reliability. Thus, the organic EL element can provide the electronic device having high long-term reliability.

Since the organic EL device is of a substrate-side light emission type, a material to form the substrate 1 includes a transparent or high transmissive material in which light can be transmitted, wherein the transparent or high transmissive material includes, for example, transparent glass; quartz crystal; sapphire; and a transparent synthetic resin such as polyester, polyacrylate, polycarbonate, or polyether ketone. In this case, the sealing substrate 12 may include a metal laminate film.

In contrast, when the organic EL device is of a sealing-side light emission type, the following material may be used: ceramic, such as alumina; a metal sheet, such as a stainless sheet, subjected to insulating treatment, such as surface oxidation; a thermosetting resin; or a plastic resin. If a layer including a high reflective material is placed on the back of each anode, a substrate including the same material as that of the organic EL device that is of a substrate-side light emission type may be used. The sealing substrate 12 includes such a transparent or high transmissive material in which light can be transmitted.

The anodes 3 preferably include a high transmissive material containing indium tin oxide (ITO) and having a large work function. Each hole injection/transport layer 6 is preferably the organic conductive layer including the composition according to the present invention, that is, the composition in which the changing rate of the viscosity is within a range of ±5% when 30 days have passed after the preparation, as described above.

A material to form the light-emitting layers 7 includes polymers containing an organic luminescent dye that is of a fluorescent high or low molecular type or a low molecular weight dye dispersed therein. That is, various luminescent materials, such as fluorescent materials and phosphorescent materials can be used. Among conjugated polymers to form the luminescent materials, a polymer having an arylene vinylene structure or a polyfluorene structure is particularly preferable. Low molecular weight fluorescent materials include naphthalene derivatives; anthracene derivatives; perylene derivatives; dyes, such as polymethine dyes, xanthene dyes, coumarin dyes, and cyanine dyes; metal complexes containing 8-hydroquinone or a derivative thereof; aromatic amines; tetraphenylcyclopentadiene derivatives; and known materials disclosed in Japanese Unexamined Patent Application Publication No. 57-51781 or Japanese Unexamined Patent Application Publication No. 59-194393. The cathode 9 is preferably a metal electrode containing lithium (Li), calcium (Ca), magnesium (Mg), fluoride thereof, aluminum (Al), gold (Au), silver (Ag), or the like.

An electronic transfer layer or an electronic injection layer may be placed between the cathode 9 and each light-emitting layer 7 according to needs.

The organic EL device of this exemplary embodiment is of an active matrix type and therefore a plurality of data lines and scanning lines, which are not shown, are arranged above the substrate 1 in a grid in actual. In the organic EL element, pixels that are partitioned with the data lines and scanning lines and arranged in a matrix are connected to driving TFTs, such as switching transistors and driving transistors. Therefore, when driving signals are supplied through each data line and scanning line, a current is applied between electrodes of each pixel, thereby causing each light-emitting layer 7 of the organic EL element to emit light. That is, the pixel is turned on.

Method to Manufacture Organic EL Elements and Method to Manufacture Electronic Device Including the Same A method to manufacture an organic EL device according to an exemplary embodiment of the present invention will now be described with reference to FIG. 3. FIG. 3 is a sectional view showing a principal portion of the organic EL device according to the exemplary embodiment of the present invention.

Anodes 3 are provided above a substrate 1, on which TFTs 2 each functioning as a driving circuit of an organic EL element are arranged, using indium tin oxide (ITO). $SiO_2$ banks 4 are then provided above the resulting substrate 1.

Partitions 8 including a resin are then each provided on the corresponding $SiO_2$ banks 4. Hole injection/transport layers 6 having a thickness smaller than that of the $SiO_2$ banks 4 are each provided in corresponding regions that are surrounded by the $SiO_2$ banks 4 and disposed on the anodes 3. Light-emitting layers 7 are each provided in regions that are surrounded by the partitions 8 and disposed on the $SiO_2$ banks 4 and the hole injection/transport layers 6.

A cathode 9 is then provided over the light-emitting layers 7 and the partitions 8 including organic banks.

According to the above procedure, the following components that form each organic EL element are obtained: the cathode 9, each light-emitting layer 7, each hole injection/transport layer 6, and each anode 3.

A protective layer 10 is then provided on the upper surface of the cathode 9, which is a component of the organic EL element. An adhesive agent is applied onto the protective layer 10 and the organic EL elements and a sealing substrate 12 is pressed on the adhesive agent, thereby forming an adhesive layer 11 and fixing the sealing substrate 12.

According to the above procedure, an electronic device (organic EL device) including the organic EL elements according to an aspect of the present invention and driving circuits therefore is obtained.

In the above-mentioned manufacturing steps, the above layers may be prepared by any thin-film preparing method; however, at least the hole injection/transport layers 6 and the light-emitting layers 7 are preferably prepared by an inkjet process.

Figure 4:
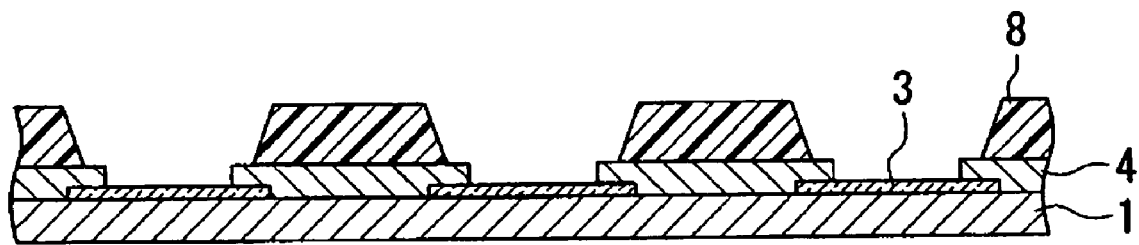
FIG. 4 is a schematic sectional view showing a configuration of a substrate included in an organic EL element according to an exemplary embodiment of the present invention.

FIG. 4 is a schematic sectional view showing a configuration of the substrate having no hole injection/transport layers 6 to be formed by an inkjet process. In FIG. 4, reference numeral 1 represents the substrate, reference numeral 3 represents the anodes, reference numeral 4 represents the SiO$_2$ banks, and reference numeral 8 represents the partition banks including an organic material. Regions surrounded by the anodes and banks correspond to pixel regions.

FIGS. 5 to 8 are schematic sectional views showing a step of manufacturing the organic EL device according to an exemplary embodiment of the present invention. A procedure to prepare the hole injection/transport layers 6 and the light-emitting layers 7 by an inkjet process is herein described in detail.

Figure 5:
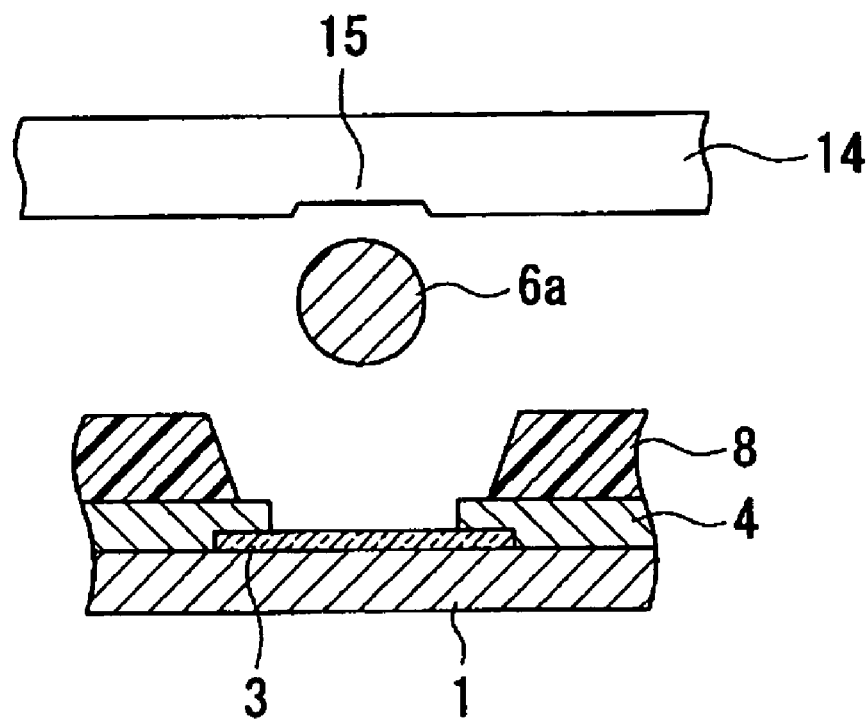
FIG. 5 is a schematic sectional view showing a step of manufacturing an organic EL device according to an exemplary embodiment of the present invention.

FIG. 5 is a schematic sectional view showing a configuration of the substrate having no hole injection/transport layers 6. The following situation is illustrated: a composition 6a to form the hole injection/transport layers 6 is discharged from nozzle holes 15 of an inkjet head 14 toward the surfaces of the anodes 3 surrounded by the SiO$_2$ banks 4 and the organic partition banks 8. In a step before the discharging step, the anodes 3 and the SiO$_2$ banks have been surface-treated so as to have an affinity to ink and the organic partition banks 8 have been surface-treated so as to have an ink-repellent property. In the surface-treatment step, O2 plasma treatment and CF4 plasma treatment were continuously performed under atmospheric temperature.

Figure 6:
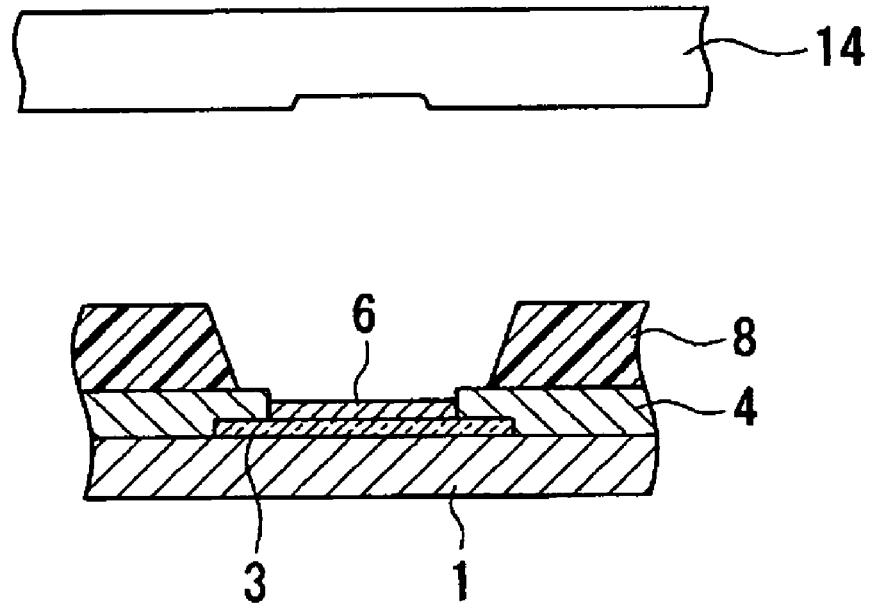
FIG. 6 is a schematic sectional view showing another step of manufacturing the organic EL device according to an exemplary embodiment of the present invention.

FIG. 6 is a schematic sectional view illustrating a situation after each hole injection/transport layer 6 is formed by providing the composition 6a in a pixel and then drying the same. Since the composition 6a contains an organic conductive material and at least one species of solvent and the changing rate of the composition viscosity is within a range of ±5% when 30 days have passed after the preparation, the periphery portion of the surface of the hole injection/transport layer 6, as well as the center portion, remains flat without depending on the elapsed time after the preparation, wherein the periphery portion is in contact with each SiO$_2$ bank 4.

Figure 7:
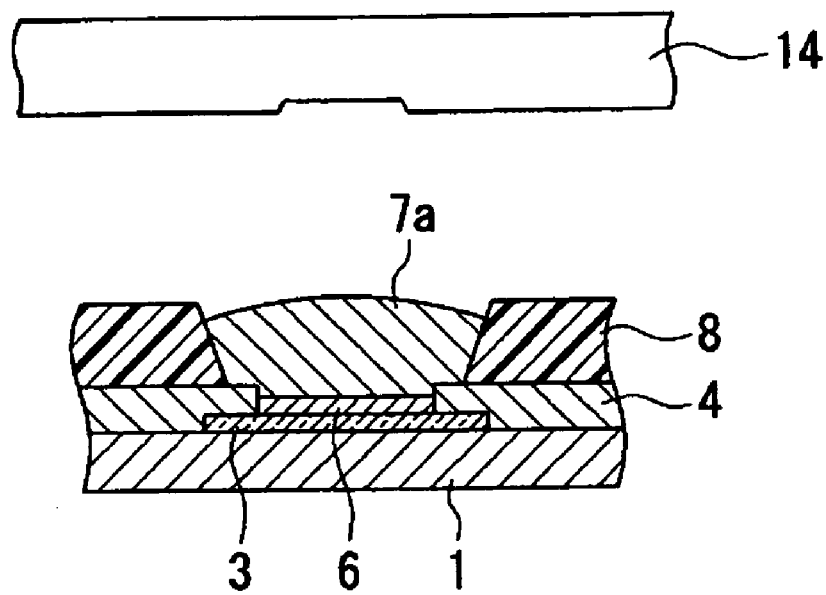
FIG. 7 is a schematic sectional view showing another step of manufacturing the organic EL device according to an exemplary embodiment of the present invention.

FIG. 7 is a schematic sectional view illustrating such a situation that a composition 7a to form the light-emitting layers 7 each placed on the corresponding hole injection/transport layers 6 is disposed in each pixel.

Figure 8:
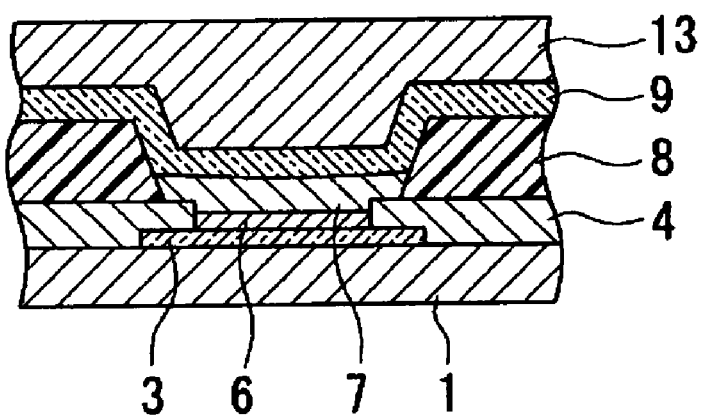
FIG. 8 is a schematic sectional view showing another step of manufacturing the organic EL device according to an exemplary embodiment of the present invention.

FIG. 8 is a schematic sectional view illustrating such a situation that a sealing layer 13 is disposed on the cathode 9 formed according to the following procedure. The light-emitting layer-forming composition 7a provided on each hole injection/transport layer 6 is dried so that each light-emitting layer 7 is formed. The cathode 9 is then formed over the light-emitting layer 7 and each organic bank (partition) 8. The term sealing layer 13 is a generic name for the protective layer 10, the adhesive layer 11, and the sealing substrate 12 shown in FIG. 3.

As shown in FIG. 6, when the hole injection/transport layers 6 are formed by an inkjet process using the hole injection/transport composition having satisfactory storage stability, thin-films satisfactory in flatness can be each precisely formed in corresponding minute regions surrounded by the banks 4 and 8. The organic EL elements including the hole injection/transport layers 6 formed by an inkjet process have such an advantage that the element life is extremely long.

Elements having the following configuration were prepared: a configuration in which each hole injection/transport layer 6 formed using one of two species of compositions A and B is placed between a cathode and an anode without forming the light-emitting layer. The elements were sequentially examined for changes in resistance after the preparation of ink. Table 3 shows the measurement result of the resistance of each element formed using one of the compositions on the day when the ink has been prepared or when 10, 20, or 30 days have passed after the preparation of the ink. more satisfactory long-term stability in resistance as compared with elements B including conventional composition B. That is, elements A each including the hole injection/transport layer 6 including composition A according to the present invention have smaller changes in conductive property as compared with elements B irrespective of the storage period of the compositions.

The inventors prepared organic EL element A' including blue light-emitting layers 7 each disposed on the corresponding hole injection/transport layers 6 including composition A according to the present invention and also prepared organic EL element B' including the blue light-emitting layers 7 each disposed on the corresponding hole injection/transport layers 6 including related art composition B. The inventors then examined two organic EL elements A' and B' for the element life. The term element life herein refers to the time that elapses until the luminance of an element decreases by half when a constant current is continuously applied to the element. As a result, it was confirmed that element A' has an element life 2.5 times longer than that of element B'. The long life of element A' is presumed to be due to the effect of the composition having long-term stability.

Since the solvent, which is a component of the composition according to an aspect of the present invention, contains the glycol medium, the composition has an extremely small changing rate of viscosity, that is, the composition is stable. The result of the following examination will now be described: the examination of the optimum content of the glycol medium in the solvent.

Diethylene glycol (a boiling point of 245° C.), which is one of glycol media, was employed, and compositions A each containing corresponding solvents were prepared in advance, the content of diethylene glycol in the solvents being 0, 15, 30, 40, 45, 50, 55, and 60 percent by weight. A plurality of elements A, each including the corresponding hole injection/transport layers 6, each including corresponding compositions A having the different contents were prepared. Element A containing the solvent having a diethylene glycol content of, for example, 45 percent by weight is herein referred to as element A(45). When the number inside the parentheses is 0, the solvent does not contain diethylene glycol.

Table 4 shows results obtained by measuring elements A, having different diethylene glycol contents (the unit is percent by weight), for the discharging properties of the compositions, the pixel flatness, and the layer profile.

The term pixel flatness refers to the ratio (the unit is ±%) of the thickness of each hole injection/transport layer 6 to the distance between the highest location (most thick portion) and the lowest location (most thin portion) of on the surface of the hole injection/transport layer 6. Symbol x represents a sample that cannot be evaluated for the pixel flatness. The term layer profile refers to a surface shape of a sectional view of a layer and is expressed by the term convex shape, flat shape, or concave. The actual layer thickness (profile of a sectional view) was measured using a probe profilometer. The discharging property is an indicator showing whether plugging is caused or not and whether the discharged composition flies in a straight line or not when composition A is discharged from nozzle holes by an inkjet process. Symbol A represents that both the items are satisfactory, Symbol B represents that one of the items is satisfactory, and Symbol C represents that both the items are not satisfactory.

TABLE 4

| Diethylene glycol content | 0 | 15 | 30 | 40 | 45 | 50 | 55 | 60 |
|---|---|---|---|---|---|---|---|---|
| Pixel flatness | x | >50 | 40 | 20 | 18 | 15 | 15 | 25 |
| Layer profile | Convex | Convex | Convex | Slightly Convex | Slightly Convex | Flat | Flat | Concave |
| Discharging property | A | A | A | A | A | A | A | A |

Table 4 shows that the pixel flatness can be controlled within a range of ±20, the layer profile can be maintained substantially flat, and the discharging property is satisfactory when the diethylene glycol medium content in the solvent is controlled within a range of 40 to 50 percent by weight.

Since the solvent, which is a component of the composition according to an aspect of the present invention, contains an acetylenic alcohol surfactant in addition to the alcohol medium, the dispersibility is satisfactory and the surface tension is low. The result of the following examination will now be described: the examination of the optimum content (percent by weight) of the acetylenic alcohol surfactant.

Table 5 shows the element efficiency, element life, and pixel flatness obtained by examining blue light-emitting elements A' prepared using 3,5-dimethyl-1-octyne-3-ol (SF 61, manufactured by Air Products and Chemicals Inc. and herein referred to as SF 61, having a boiling point of 160° C.), which is an example of the acetylenic alcohol surfactant.

Diethylene glycol, which is one of glycol media, was used and the content was set to 50 percent by weight.

The above element has a configuration in which an anode including ITO, the hole injection/transport layer including composition A or B, a cathode including Al arranged in that order. This configuration includes the same substrate as that shown in FIG. 4.

In order to form the hole injection/transport layer 6 using composition A or B, an inkjet process was employed.

In Table 3, the term elements A refers to elements each including the hole injection/transport layer 6 formed using composition A and the term elements B refers to elements each including the hole injection/transport layer 6 formed using composition B. In the number of days shown in Table 3, the number "0" refers to that elements are each formed using the corresponding compositions on the day when the ink has been prepared and examined for the resistance.

TABLE 3

| | Number of Days after Preparation of Ink | | | |
|---|---|---|---|---|
| | 0 | 10 | 20 | 30 |
| Elements A | $1.5 \times 10^{-5}$ | $1.6 \times 10^{-5}$ | $1.9 \times 10^{-5}$ | $1.5 \times 10^{-5}$ |
| Elements B | $1.5 \times 10^{-5}$ | $3.0 \times 10^{-5}$ | $1.2 \times 10^{-6}$ | $4.5 \times 10^{-7}$ |

As shown in Table 3, in elements A each including the hole injection/transport layer 6 including composition A according to an aspect of the present invention, the resistance of an element formed using the composition when 20 days have passed after the preparation of the composition is substantially the same as that of an element formed using the composition just after the preparation (0 day). This tendency is maintained until 30 days have passed after the preparation of the element.

In contrast, in elements B including the hole injection/transport layer 6 including related art composition B, the resistance of an element formed using the composition when 10 days have passed after the preparation of the composition is two times larger than that of an element formed using the composition just after the preparation (0 day). The resistance of an element formed using the composition when 20 days have passed after the preparation of the composition increases in value by 10 times and the resistance of an element formed using the composition when 30 days have passed increases in value by more than 100 times.

The above result shows that elements A each including the hole injection/transport layer 6 including composition A according to the present invention have The term element efficiency refers to a luminance per unit current (candela/ampere) and is herein expressed by an index value obtained by normalizing the luminance of an element containing no SF 61 to an index value of 1. The term element life refers to the time that elapses until the luminance of a light-emitting element decreases by half when a constant current is continuously applied to the element and is herein expressed by an index value obtained by normalizing the time of the element containing no SF 61 to an index value of 1. The term pixel flatness refers to the ratio (the unit is ±%) of the thickness of each hole injection/transport layer 6 to the distance between the highest location (most thick portion) and the lowest location (most thin portion) of on the surface of the hole injection/transport layer 6. Symbol x represents a sample that cannot be evaluated for the pixel flatness.

TABLE 5

| SF 61 Content | 0 | 0.01 | 0.05 | 0.1 | 0.5 |
|---|---|---|---|---|---|
| Element efficiency | 1.0 | 1.0 | 1.2 | 1.05 | 1.2 |
| Element Life | 1.0 | 1.0 | 1.0 | 1.1 | 0.8 |
| Pixel Flatness | >50 | 20 | 15 | 15 | 25 |

Table 5 shows that the pixel flatness can be controlled within a range of ±0 and the element properties, such as the element efficiency and the element life are satisfactory when the SF 61 content is controlled within a range of 0.01 to 0.1.

Table 6 shows the element efficiency, element life, and pixel flatness obtained by examining blue light-emitting elements A' prepared using 3,5-dimethyl-4-octyne-3,6-dithiol (SF 82W, manufactured by Air Products and Chemicals Inc. and herein referred to as SF 82W, having a boiling point of 220° C.), which is an example of the acetylenic alcohol surfactant. Other preparing conditions are the same as those shown in Table 5.

TABLE 6

| SF 82W Content | 0 | 0.01 | 0.05 | 0.1 | 0.5 |
|---|---|---|---|---|---|
| Element efficiency | 1.0 | 1.1 | 1.0 | 0.9 | 0.7 |
| Element Life | 1.0 | 0.9 | 0.95 | 0.9 | 0.7 |
| Pixel Flatness | >50 | 20 | 15 | 10 | 10 |

Table 6 shows that the pixel flatness can be controlled within a range of ±20 and the element efficiency and the element life are satisfactory when the SF 82W content is controlled within a range of 0.01 to 0.1. For SF 82, an increase in content enhances the flatness but deteriorates the element properties.

According to the results of the above-mentioned two tables 5 and 6, since the solvent, which is a component of the composition according to an aspect of the present invention, contains an acetylenic alcohol surfactant in addition to the glycol medium, the dispersibility is satisfactory. Furthermore, the element efficiency and the element life are substantially the same as those of an element containing no surfactant and the flatness of obtained pixel extremely satisfactory when the content (percent by weight) of the acetylenic alcohol surfactant is controlled within a range of 0.01 to 0.1.

Organic EL element C containing the following surfactant instead of SF 61 (a boiling point of 160° C.) and SF 82W (a boiling point of 220° C.) is decreased in element efficiency by 20% and decreased in element life by 30% as compared with the above element A': surfactant S104 (manufactured by Air Products and Chemicals Inc.) having a boiling point higher than that of diethylene glycol (a boiling point of 245° C.).

The inventors have concluded based on this result that the above-mentioned acetylenic alcohol surfactant preferably has a boiling point that is less than or equal to that of the medium, which is a component of the solvent as well as this surfactant.

Organic Semiconductor Element

Figure 9:
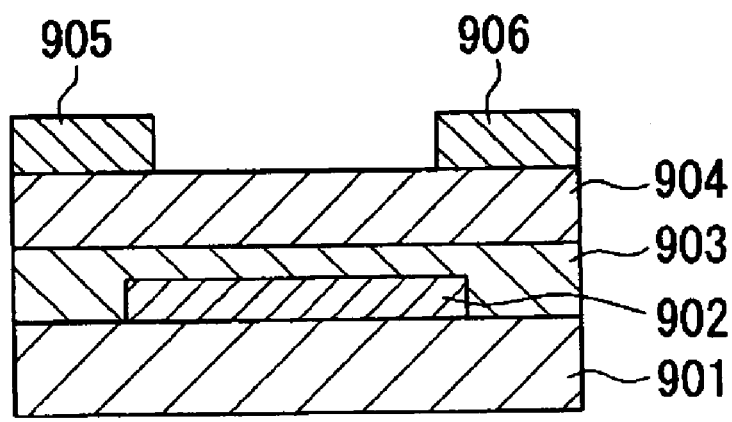
FIG. 9 is a side sectional view showing a schematic configuration of an exemplary organic semiconductor element according to an exemplary embodiment of the present invention.

FIG. 9 is a schematic sectional view showing an example of an organic semiconductor element according to an aspect of the present invention.

The organic semiconductor element having a configuration shown in FIG. 9 includes a substrate 901 and a gate electrode 902 disposed thereon. A gate insulating layer 903 including an insulating material having a large dielectric constant is disposed over the substrate 901 and the gate electrode 902, and a channel 904 is disposed on the gate insulating layer 903. A source electrode 905 and a drain electrode 906 are arranged on the channel 904. These components form the organic semiconductor element for preparing a thin-film transistor. In this example, the three electrodes, that is, the gate electrode 902, the source electrode 905, and the drain electrode 906 were prepared using the composition according to an aspect of the present invention by an inkjet process.

As described above, since the electrodes according to an aspect of the present invention are flat, electrons and holes moving in the electrodes containing the organic semiconductive layer can extremely constantly move therein. That is, constant current flows can be maintained in the above electrodes for a long period and therefore organic semiconductor elements having high long-term reliability can be provided.

In FIG. 9, the gate electrode 902, the source electrode 905, and the drain electrode 906 among conductive portions included in an integrated circuit include the organic conductive layer containing the composition according to an aspect of the present invention; however, the channel 904 may include the organic conductive layer according to an aspect of the present invention. Furthermore, the organic conductive layer may be used to form wiring lines, not shown, to connect such thin-film transistors.

A method to manufacture organic semiconductor elements, wherein a source, a drain, a gate and/or wiring lines, which are conductive portions included in an integrated circuit, including the above-mentioned organic conductive layer are formed by an inkjet process.

In the organic semiconductor element-manufacturing method, having the above constitution, according to an aspect of the present invention, functional layers can be formed in a pattern by an inkjet process, which is a simple process. Therefore, a large-scale vacuum process and photolithographic process, which must be used to manufacture layers by a related art manufacturing method, need not to be used to form such organic semiconductor elements having high long-term reliability.

Thus, the organic semiconductor element-manufacturing method according to an aspect of the present invention greatly contributes to the production of inexpensive organic semiconductor elements because the manufacturing cost can be greatly saved.

Electronic Apparatus

An exemplary electronic apparatus including an electronic device including the above-mentioned organic EL device will now be described.

Figure 10:
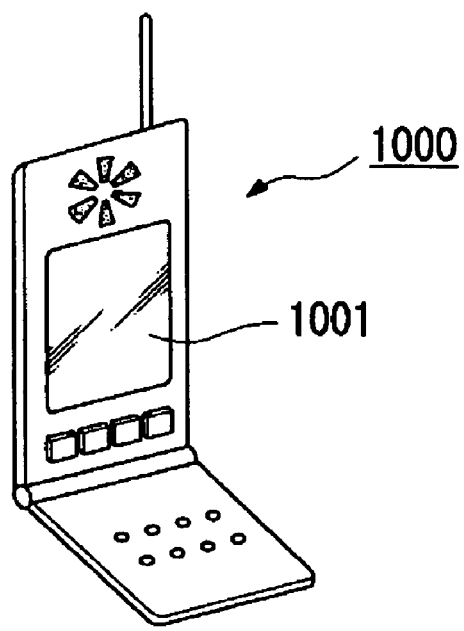
FIG. 10 is a perspective view showing an exemplary electronic apparatus including an electronic device of this exemplary embodiment.

FIG. 10 is a perspective view showing an example of a mobile phone. In FIG. 10, reference numeral 1000 represents a mobile phone body and reference numeral 1001 represents a display section including the above organic EL device (electronic device).

Figure 11:
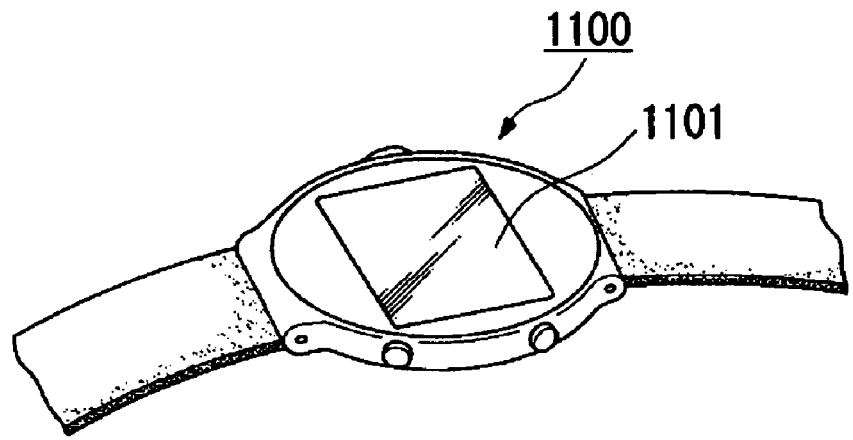
FIG. 11 is a perspective view showing another exemplary electronic apparatus including the electronic device of an exemplary embodiment.

FIG. 11 is a perspective view showing an example of a watch-type electronic apparatus. In FIG. 11, reference numeral 1100 represents a watch body and reference numeral 1101 represents a display section including the above organic EL device (electronic device).

Figure 12:
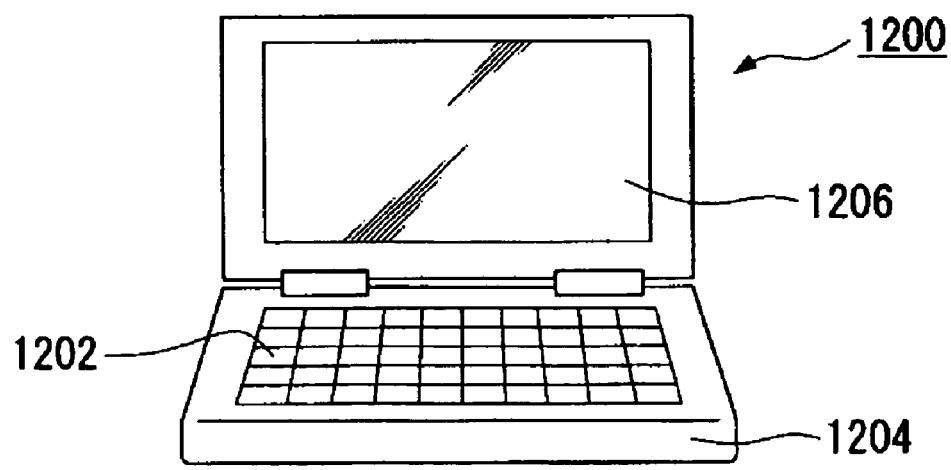
FIG. 12 is a perspective view showing another exemplary electronic apparatus including the electronic device of an exemplary embodiment.

FIG. 12 is a perspective view showing an example of a portable information processor, such as a word processor or a personal computer. In FIG. 12, reference numeral 1200 represents the information processor, reference numeral 1202 represents an input section, such as a key board, reference numeral 1204 represents an information processor body, and reference numeral 1206 represents a display section including the above organic EL device (electronic device).

Since the electronic apparatuses shown in FIGS. 10 to 12 each include the organic EL device (electronic device) of the above exemplary embodiment, the luminance of the display sections can be maintained constant over the long term. Thus, electronic apparatuses having high long-term reliability can be provided. When these electronic apparatuses each include the above-mentioned organic semiconductor element, the manufacturing cost of the electronic apparatuses can be saved.

The technical scope of the present invention is not limited to the above exemplary embodiments and various modifications may be performed within the scope of the present invention. Particular materials and layer configurations described in the exemplary embodiments each show only an example and various modifications may be performed.

In the organic EL device of the above exemplary embodiment, for example, the anodes 3 function as pixel electrodes and the cathode 9 functions as a counter electrode. However, the cathode 9 may be used as a pixel electrode and the anodes 3 may be used as counter electrodes.

ADVANTAGES

As described above, a composition according to an aspect of the present invention contains an organic conductive material and at least one species of solvent. Since the changing rate of the viscosity is within a range of ±5% when 30 days have passed after the preparation, organic conductive layers having satisfactory surface flatness and stability can be formed using this composition without depending on the time that has elapsed after the preparation of the composition.

The above composition is satisfactory in long-term storage property because the changing rate of the viscosity is small. Therefore, since the composition can be manufactured at low cost by a mass production process, the composition can be marketed alone and used in various industrial applications.

Since flat organic conductive layers can be formed by an inkjet process, in which an expensive vacuum unit is not necessary, using the above composition with high reproducibility, such organic conductive layers can be provided by an organic conductive layer-manufacturing method according to an aspect of the present invention at low cost.

In particular, in the organic conductive layer-manufacturing method according to an aspect of the present invention, the composition, in which the viscosity is hardly changed with the passage of time, is used. The method includes an applying step of applying the composition to different portions. Thus, layers having a surface in which the periphery portion in contact with a wall is flat as well as the center portion can be readily obtained when such layers are each formed in corresponding minute regions.

An organic EL device (electronic device) in which the time that elapses until the luminance decreases by half is long can be obtained by preparing hole injection/transport layers, included in organic EL elements, using the organic conductive layers.

When a source, a drain, a gate and/or wiring lines among conductive portions included in an integrated circuit include the above-mentioned organic conductive layer, electrons and holes moving in these conductive portions can smoothly flow. Thus, organic semiconductor elements having high long-term reliability can be obtained.

Furthermore, an electronic apparatus including the above-mentioned organic EL device and/or organic semiconductor elements has performance that can be maintained over the long term. An electronic apparatus including this electronic apparatus has greatly enhanced long-term reliability.

The invention claimed is:

1. A composition, comprising:
    an organic conductive material and at least one species of solvent, the solvent containing glycol medium and an acetylenic alcohol surfactant, and the content of the acetylenic alcohol surfactant in the solvent ranging from 0.01 to 0.1 percent by weight.

2. The composition according to claim 1, the content of the glycol medium in the solvent ranging from 40 to 55 percent by weight.

3. The composition according to claim 1, the glycol medium including diethylene glycol and a mixture containing the same.

4. The composition according to claim 1, the glycol medium including monoethylene glycol and a mixture containing the same.

5. The composition according to claim 1, the glycol medium including triethylene glycol and a mixture containing the same.

6. The composition according to claim 1, the organic conductive material including polythiophene derivatives.

7. The composition according to claim 1, the organic conductive material including a mixture of polydioxythiophene and polystyrene sulfonic acid.

8. The composition according to claim 1, the organic conductive material including a mixture of polyaniline and polystyrene sulfonic acid.

9. The composition according to claim 1, the acetylenic alcohol surfactant having a boiling point that is less than or equal to that of the medium as well as the surfactant contained in the solvent.

10. The composition according to claim 1, the acetylenic alcohol surfactant includes 3,5-dimethyl-1-octyne-3-ol.

11. The composition according to claim 1, the composition being subjected to degassing treatment.

12. The composition according to claim 11, the degassing treatment being performed at a vacuum pressure that is less than or equal to the saturation vapor pressure of water.

13. The composition according to claim 11, before the degassing treatment, the composition containing an amount of the medium vaporized in the degassing treatment in advance.

14. A method to manufacture organic conductive layers, comprising:
    applying a composition to different portions of a substrate by an inkjet process, the composition being set forth in claim 1.

15. The organic conductive layer-manufacturing method according to claim 14, further comprising:
    removing a solvent after the application step.

16. The organic conductive layer-manufacturing method according to claim 15, the removing being performed in a vacuum atmosphere.

17. The organic conductive layer-manufacturing method according to claim 16, the removing being performed at a pressure of $1.333 \times 10^{-3}$ Pa or less and a temperature substantially equal to room temperature.

18. The organic conductive layer-manufacturing method according to claim 15, further comprising:
    performing thermal treatment at 100° C. or more after the removing.

19. The organic conductive layer-manufacturing method according to claim 18, a heat source used in the thermal treatment including infrared rays.

20. A method to manufacture organic EL elements, comprising: forming hole injection/transport layers each including the composition of claim 1 by an inkjet process.

21. A method for manufacturing organic semiconductor elements, comprising:
    forming a drain, a gate or wiring lines, which are conductive portions included in an integrated circuit, by an inkjet process using the composition of claim 1.

* * * * *